(12) United States Patent
Sugg

(10) Patent No.: US 6,489,635 B1
(45) Date of Patent: Dec. 3, 2002

(54) EPITAXIALLY GROWN P-TYPE DIFFUSION SOURCE FOR PHOTODIODE FABRICATION

(75) Inventor: Alan Richard Sugg, Langhorne, PA (US)

(73) Assignee: Sensors Unlimited, Princeton, NJ (US)

( * ) Notice: Subject to any disclaimer, the term of this patent is extended or adjusted under 35 U.S.C. 154(b) by 0 days.

(21) Appl. No.: 09/763,422

(22) PCT Filed: Feb. 10, 2000

(86) PCT No.: PCT/US00/03474
§ 371 (c)(1),
(2), (4) Date: Feb. 20, 2001

(87) PCT Pub. No.: WO00/52742
PCT Pub. Date: Sep. 8, 2000

Related U.S. Application Data

(60) Provisional application No. 60/122,185, filed on Mar. 1, 1999.

(51) Int. Cl.[7] ............................................. H01L 27/15
(52) U.S. Cl. ............................ 257/79; 257/82; 257/83; 257/84; 257/102; 257/103; 257/184; 257/225; 257/233
(58) Field of Search ............................... 257/79, 83, 82, 257/84, 102, 103, 184, 233, 225

(56) References Cited

U.S. PATENT DOCUMENTS

| | | | |
|---|---|---|---|
| 3,836,399 A | | 9/1974 | Pruett |
| 4,597,004 A | | 6/1986 | Longeway et al. |
| 4,616,246 A | | 10/1986 | Delahoy |
| 4,661,961 A | | 4/1987 | Nelson et al. |
| 4,696,828 A | | 9/1987 | Schachter et al. |
| 4,731,789 A | * | 3/1988 | Thornton ............... 257/22 |
| 4,746,620 A | | 5/1988 | Diadiuk et al. |
| 4,870,652 A | * | 9/1989 | Thornton ............... 372/45 |
| 4,926,229 A | | 5/1990 | Nakagawa et al. |
| 5,212,705 A | * | 5/1993 | Kahen et al. .......... 372/45 |
| 5,317,170 A | * | 5/1994 | Paoli ..................... 257/88 |
| 5,742,631 A | * | 4/1998 | Paoli ..................... 372/45 |
| 6,180,961 B1 | * | 1/2001 | Ogihara et al. ........ 257/79 |
| 6,313,483 B1 | * | 11/2001 | Ogihara et al. ........ 257/102 |
| 6,384,429 B1 | * | 5/2002 | Ogihara et al. ........ 257/101 |

FOREIGN PATENT DOCUMENTS

| | | | | |
|---|---|---|---|---|
| EP | 62062567 | * | 3/1987 | ........ 257/94 |

OTHER PUBLICATIONS

C. Koeppen, J.L. Wagener, T.A. Strasser, and J. DeMarco, "High Resolution Fiber Granting Optical Network Monitor," Proc. National Fiber Optic Engineers Conference, 1988.

G. H. Olsen, "InGaAs Fills the Near–IR Array Vacuum," Laser Focus World 27, p. 48, (1991).

Y. Yamamato, H. Kanabe, "Zn diffusion in In Ga As with ZnAs Source," Japn, J. of Appl. Phys. vol. 19, No. 1, Jan 1980 pp. 121–128.

(List continued on next page.)

*Primary Examiner*—Eddie Lee
*Assistant Examiner*—Eugene Lee
(74) *Attorney, Agent, or Firm*—Richard C. Woodbridge, Esq.; Woodbridge & Associates, PC

(57) ABSTRACT

A p-i-n photodiode included a heavily dopes epitaxially grown layer of semiconductor. The photodiode is comprised of heterojunctions of epitaxial material grown on an InP semiconductor substrate (12, 14). A heavily doped layer (20) is patterned on top of an InP layer (18) to define the source of p-type diffusion for the definition of the active region (22) of the p-n junction. The epitaxially grown source layer (20) may be comprised of ternary or quaternary III–V semiconductor alloys, typically $In_xGa_{1-x}As$. The principle can be extended to alloy layers that are not lattice-matched to the InP substrate. The p-type dopant is typically Zn, but may also consist of other commonly used p-type dopants such as Be.

8 Claims, 5 Drawing Sheets

OTHER PUBLICATIONS

M. Wada, M. Seko, K. Sakakibara, and Y. Sekiguchi, "Zn Diffusion into InP Using Dimethylzinc as a Zn Source", Japn, Appl. Phys., vol. 28 No. 10, Oct., 1989, pp. L1700–L1703.

C. Blaauw, et al., Secondary Ion Mass Spectrometry and Electrical Characterization of Zn Diffusion in N–Type–InP,: J Appl. Phys. 66 (2), 1989, pp. 605–610.

N. Arnold, R. Schmitt, K. Heime, "Diffusion in III–V Semiconductors From Spin–On Film Sources," J. Phys. D: Appl. Phys., vol. 17, 1984, pp. 443–474.

I.M. Tiginyanu, I.V. Kravetsky, V.V. Ursaki, G. Marowski, H.L. Nartnagel, "Crystal Order Restoration and Zn–impurit Activation in InP by As++plus—Coimplantation and Annealing,". . .

* cited by examiner

EPITAXIALLY GROWN P-TYPE DIFFUSION SOURCE FOR PHOTODIODE FABRICATION

CROSS REFERENCE TO RELATED APPLICATIONS

This application claims the priority of U.S. provisional application Ser. No. 60/122,185 filed on Mar. 1, 1999.

BACKGROUND OF THE INVENTION

1. Field of the Invention

Briefly described, this invention relates to an improved method for fabricating a p-i-n semiconductor photodiode that results in improved uniformity and device scalability over large substrate sizes.

2. Description of Related Art

Linear and 2-D arrays of InGaAs p-i-n photodiodes are commercially important for a wide range of applications. Linear arrays are used as wavelength monitors for wavelength division multiplexing (WDM) communication systems (C. Koeppen, J. L. Wagener, T. A. Strasser, and J. DeMarco, "High resolution fiber grating optical network monitor," Proc. National Fiber Optic Engineers Conference, 1998.), spectroscopy (G. H. Olsen, "InGaAs Fills the Near-IR Array Vacuum," Laser Focus World 27, p. 48 (1991)), and machine vision applications. Two-dimensional arrays are used in many applications ranging from surveillance to industrial process control. Linear photodiode arrays are available with up to 512 elements, while 2-D arrays are available with up to 320×240 elements. These devices are large in comparison to most semiconductor devices. A 512 linear array is 2 cm in length and a 2-D array is also large, with a 320×240 array being 1.3 cm×1 cm. This large device size drives the need for a device structure and process which is uniform and scalable with substrate size. Conventional methods of device fabrication used a vapor-phase Zn diffusion to define the device active region.

Increasing substrate sizes characterizes the history of semiconductor fabrication. This increase in size is driven by the cost effectiveness of scaling the process to larger and larger wafer sizes. The trend is particularly true of more complex devices containing large numbers of devices, such as transistors. The compound semiconductor industry is driven by a similar trend as the devices fabricated from these materials contain a larger number and size of elements such as transistors and diodes. The GaAs industry has scaled wafer sizes from 2 inch diameters (50 mm) up to 6 inches (150 mm) in recent years as the chips fabricated from this material have achieved increasing levels of device integration. The InP-based materials systems are experiencing a similar pressure to increase the substrate size to take advantage of the cost advantages of larger wafer sizes.

As the wafer size is increased, the processing of the devices becomes more challenging. To take advantage of the larger wafer size, the process must scale with the area of the wafer. The invention discussed herein addresses the problem of scaling the diffusion of impurities to large wafer sizes.

The following patents may be generally relevant to the state of the art and the present invention.

U.S. Patent entitled "Photodetector" (U.S. Pat. No. 4,597,004) describes a photodetector in which the preferred embodiment is structured with a non-patterned p-contact layer, and in which a buffer layer is added to prevent excess diffusion from the p-doped layer.

U.S. Patent entitled "Photovoltaic Diode with First Impurity of Cu and Second of Cd, Zn, or Hg" (U.S Pat. No. 3,836,399) describes a device in which the diffusion is over a broad area and for which no specific method or patterned structure is indicated.

U.S. Patent entitled "Enhancement of Photoconductivity in Pyrolytically Prepared Semiconductors" (U.S. Pat. No. 4,616,246) describes a device prepared using n-type layers grown, but not subsequently patterned or diffused, to fabricate the device.

U.S. Patent entitled "Buried Heterostructure Devices with Unique Contact-Facilitating Layers" (U.S. Pat. No. 4,661,961) describes a fabricated device in which the contact layers are patterned by growth of additional material to define the device active region.

U.S. Patent entitled "Passivation of InP by Plasma-Deposited Phosphorus" (U.S. Pat. No. 4,696,828) shows a method for passivating surface states using a phosphorus layer.

U.S. Patent entitled "Lateral P-I-N Photodetector" (U.S. Pat. No. 4,746,620) describes a device in which the p-type and n-type regions of the photodiode are defined by alloying doped metallic contacts onto the semiconductor substrate.

Finally, U.S. Patent entitled "PIN Junction Photovoltaic Element with p or n-type Semiconductor Layer Comprising Non-Single crystal Material Containing Zn, Se, H in an Amount of 1 to 4 Atomic % and Dopant and I-Type Semiconductor Layer Comprising On-Single Crystal Si(H, F) Material" (U.S. Pat. No. 4,926,229) describes a device fabrication process which uses non-single crystal and in which H is incorporated into the material.

The existing methods of scaling the diffusion of impurities into the semiconductor in order to define the device include sealed ampoule diffusion, open tube diffusion using a gaseous diffusion source, and the use of surface-deposited films of source dopant.

Sealed ampoule diffusion (Y. Yamamato, H. Kanabe, "Zn Diffusion in $In_xGa_{1-x}As$ with $ZnAs_2$ Source," Japn. J. of Appl. Phys., vol. 19, No. 1, Jan 1980, pp. 121–128.) is characterized by the difficulty of handling large diameter quartz ampoules. In this method, the semiconductor wafer is sealed in a quartz ampoule containing a solid source of diffusion such as $ZnAs_2$. The ampoule is placed on a high vacuum pumping system and evacuated to $10^{-6}$ torr. The quartz ampoule is then sealed manually using an oxygen/hydrogen torch. The sealed ampoule is then placed in a furnace at the appropriate diffusion temperature. The deficiencies of this method include the manual handling problems involved with large diameter quartz, the large thermal mass requiring longer diffusion times, and the time consuming vacuum processing and sample preparation.

Open tube diffusion may be implemented in a number of different embodiments. Common to all of these embodiments (M. Wada, M. Seko, K. Sakakibara, and Y. Sekiguchi, "Zn diffusion into InP using dimethylzinc as a Zn source," Japn. J. of Appl. Phys., vol. 28, no. 10, October 1989, pp. L1700–L 1703; C. Blaauw, et al, "Secondary ion mass spectrometry and electrical characterization of Zn diffusion in n-type-InP," J. Appl. Phys. 66 (2), 1989, pp 605–610; N. Arnold, et al, "Diffusion in III–V semiconductors from spin-on film sources," J. Phys. D: Appl. Phys., 17, 1984, pp. 443–474.) is the requirement to maintain a sufficient overpressure of column V elements to prevent the compound semiconductor from decomposing at the temperatures required for impurity diffusion. This overpressure is usually achieved with the use of a gaseous source of phosphine ($PH_3$) or arsine ($AsH_3$). Both of these gases are extremely hazardous and require special handling, effluent control, licensing, and safety precautions. The cost of such gas handling is usually prohibitive and becomes more complex for larger and larger wafer sizes.

Spin-on diffusion sources are becoming more widely used (N. Arnold, R. Schmitt, K. Heime, "Diffusion in III–V semiconductors from spin-on film sources," J. Phys. D: Appl. Phys., vol. 17, 1984, pp. 443–474.). They are scalable with device size and do not suffer the same requirements for column V overpressure as open tube or sealed-ampoule diffusion. This process does, however, suffer from the standard process variability common to all thin film deposition techniques. The source quality (freshness) and application to the substrate require precise control.

Diffuision is the preferred method of introducing impurities for p-i-n photodiode fabrication. The principal reason is that the material damage introduced by the ion implantation process causes defects that increase the dark current of the device (I. M. Tiginyanu, I. V. Kravetsky, V. V. Ursaki, G. Marowsky, H. L. Hartnagel, "Crystal order restoration and Zn-impurity activation in InP by As++ plus—coimplantation and annealing," Physica Status Solidi (A) Applied Research v 162 n 2 August 1997. p R9–R10). Large dark currents are detrimental to photodiode performance for most applications.

In general, the prior art for diffusion of impurities are limited in process control and scalability. This invention addresses these problems in a completely scalable and controllable method.

SUMMARY OF THE INVENTION

The invention relates to photodetectors, principally p-n junction photodiodes, that are defined by the use of an epitaxially grown layer of semiconductor which is doped with the p-type impurity used to define the p-contact of the p-n junction.

Photodiodes, particularly in the array format, are required to be of uniform construction over large areas. The largest substrate diameter commonly available for manufacturing p-i-n photodiodes is 50 mm. One of the limiting steps of device definition is the diffusion of p-type impurity species that define the p-contact of the device. This disclosure proposes a method and the resulting device structure for photodiodes that uses a p-contact definition process and structure that is scalable to larger substrate sizes.

The solution consists of modifying the epitaxial growth to include a cap layer doped heavily with a p-type impurity, nominally Zn (the Zn source layer). This cap layer may consist of 1) InP, or 2) InGaAs lattice-matched to InP, or 3) of any one of a variety of ternary or quaternary III–V semiconductor alloys. This source layer is deposited epitaxially during the initial construction of the device. The Zn source layer is selectively removed by standard photolithography and etching in areas where no Zn diffusion is desired. The active device area where the Zn source layer remains will receive Zn diffusions upon annealing under the appropriate conditions, with appropriate encapsulants, typically $SiN_x$. These conditions may include sealed ampoule diffusion, open-tube diffusion (with proper encapsulation), or rapid thermal annealing (RTA).

An InP source layer may be doped up to a level of approximately $1-3 \times 10^{18}/cm^3$ without significant out-diffusion of during the epitaxial growth. Calculated diffusion into the underlying InP is less than 500 Å. The InGaAs layer may be Zn-doped up to a level of approximately $1-3 \times 10^{19}/cm^3$ without significant out-diffusion into the underlying layers during the epitaxial growth.

The process is planar, because the extent of the etch used to define the device will be only slightly larger than the extent of the Zn-source layer.

The invention may be more fully understood by reference to the following drawings.

DETAILED DESCRIPTION OF THE INVENTION

During the course of this description like numbers will be used to identify the elements according to the different views that illustrate the invention.

Figure 1:
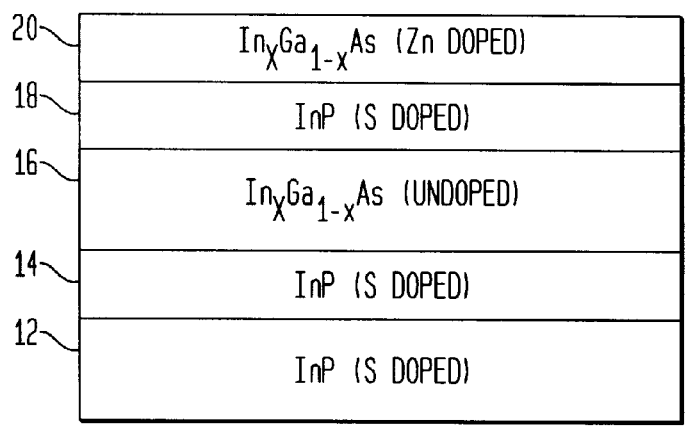
FIG. 1 is a cross section of the epitaxial material structure used to fabricate the device according to the preferred embodiment of the invention.

The preferred embodiment of the invention 10 is illustrated in FIG. 1. Layer 20 is the top layer of the device composed of InGaAs and doped heavily with Zn at a level of $\geq 1 \times 10^{19}/cm^3$. This layer forms the source of Zn in subsequent diffusion steps. The thickness of the layer may be between 100 Å and 2000 Å in the preferred embodiment. Layer 18 is an InP S-doped layer with the doping on the order of $1-5 \times 10^{16}/cm^3$. The thickness of layer 18 is generally approximately 1 μm. Layer 16 is a layer of InGaAs lattice-matched to InP with a composition x approximately equal to 0.52. The thickness of layer 16 is typically 3.5 μm. Layer 16 may be either doped or undoped in the preferred embodiment. The next layer 14 of the structure is a layer of InP typically S-doped at a level of $1-5 \times 10^{17}/cm^3$. Layer 14 serves as a buffer layer between the substrate and the InGaAs layer 16 in the structure of p-i-n photodiode. Layer 12 is typically a S-doped InP substrate with a S doping level on the order of $2 \times 10^{18}$ $cm^3$.

Figure 2:
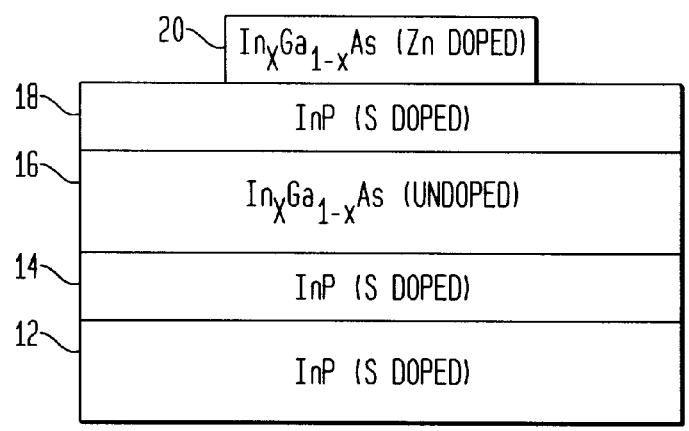
FIG. 2 is a cross section of the epitaxial structure of FIG. 1 processed to selectively remove the Zn-dopant source layer.

FIG. 2 illustrates the device structure of FIG. 1 after patterning layer 20, the InGaAs Zn-doped source layer. FIG. 2 shows the InGaAs doped layer 20 that is patterned prior to diffusion. Layer 20 is patterned using standard photolithography techniques and semiconductor etches. Layer 18 of FIG. 2 is nominally unaltered during processing.

Figure 3:
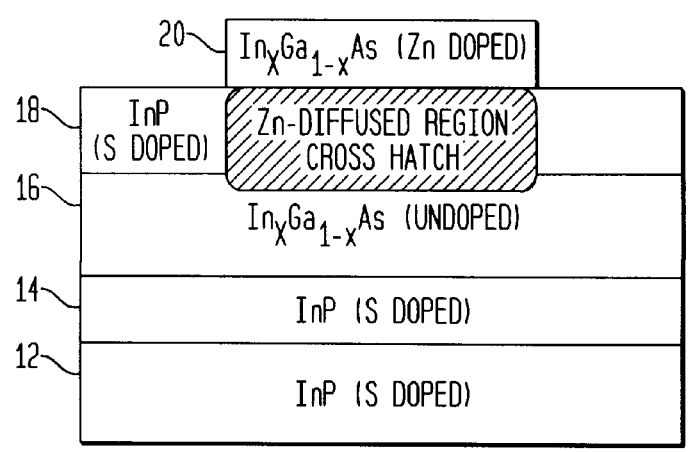
FIG. 3 is a cross section of the structure of the device having been diffused.

FIG. 3 illustrates the device after it has been diffused in a furnace at a temperature of approximately 500° C. for one-hour. Region 22 shows the portion in which the Zn has diffused from the source layer 20. In a typical embodiment of this device, Zn diffusion proceeds through the InP S-doped layer 18, and into the InGaAs undoped layer 16. The Zn diffusion region 22 forms the active region of the p-i-n photodiode.

Figure 4A:
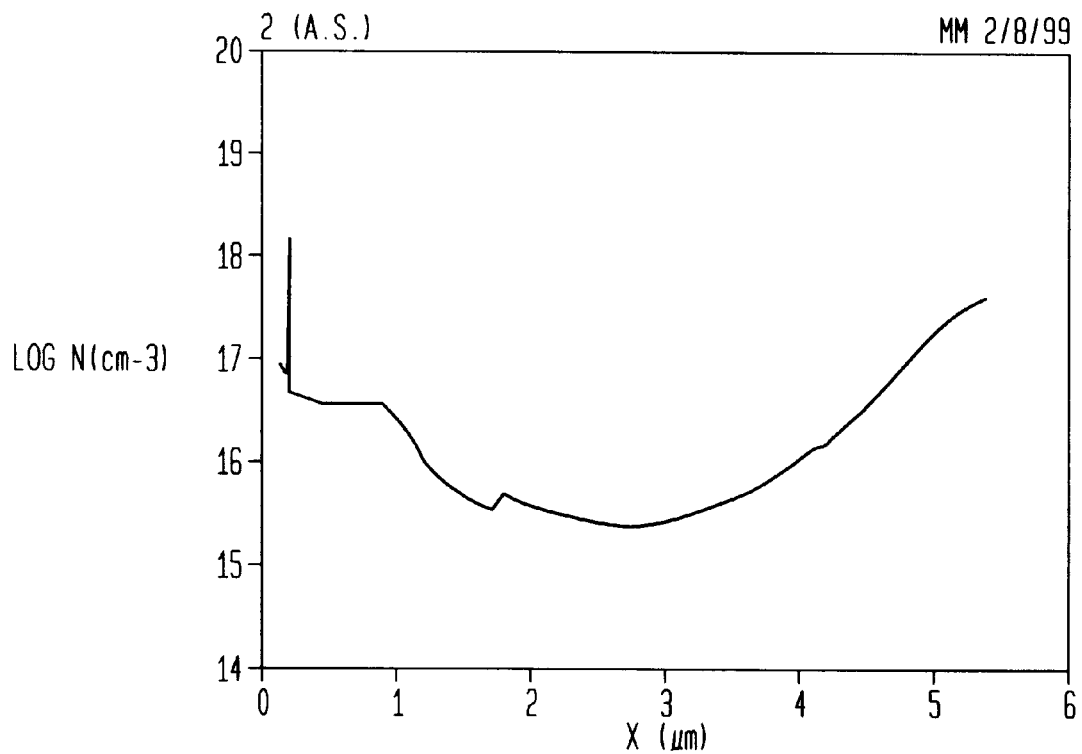
FIGS. 4a and 4b illustrate the electrochemical capacitance-voltage dopant profile of the as-grown wafer of FIG. 1.
Figure 4B:
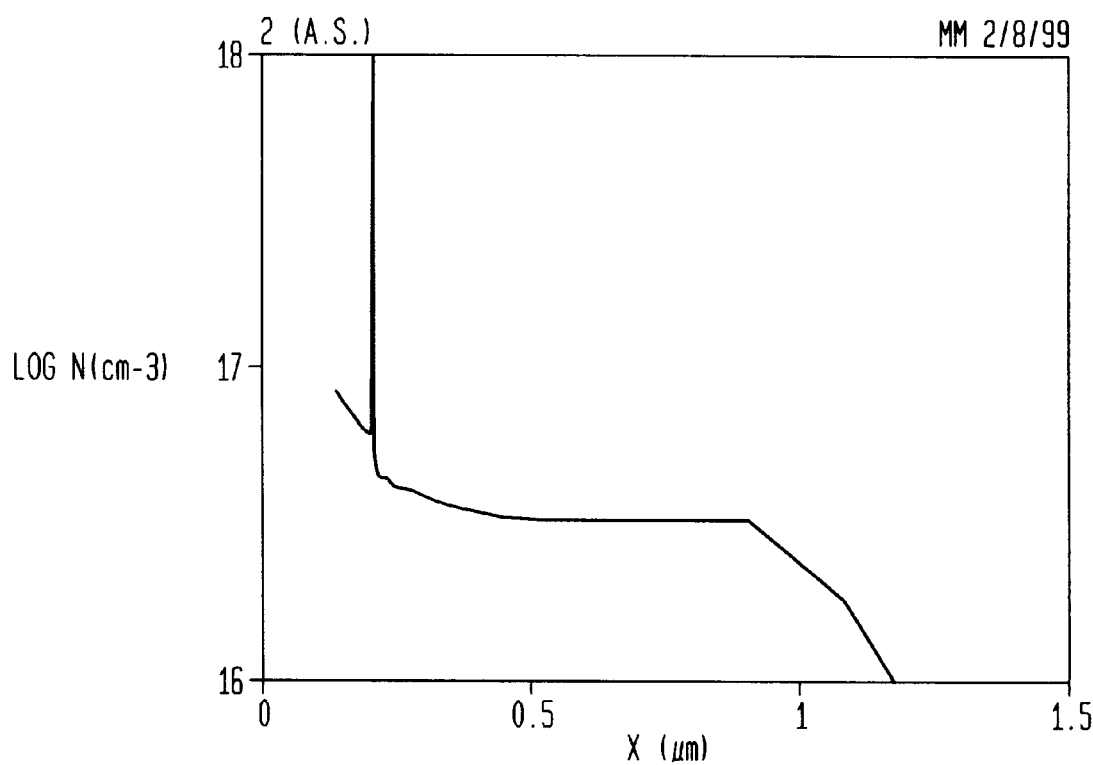

FIGS. 4a and 4b illustrate the electrochemical doping profile of the as-grown structure of FIG. 1. According to the figures, it is evident that the doping does not extend beyond the doped layer 20.

Figure 5A:
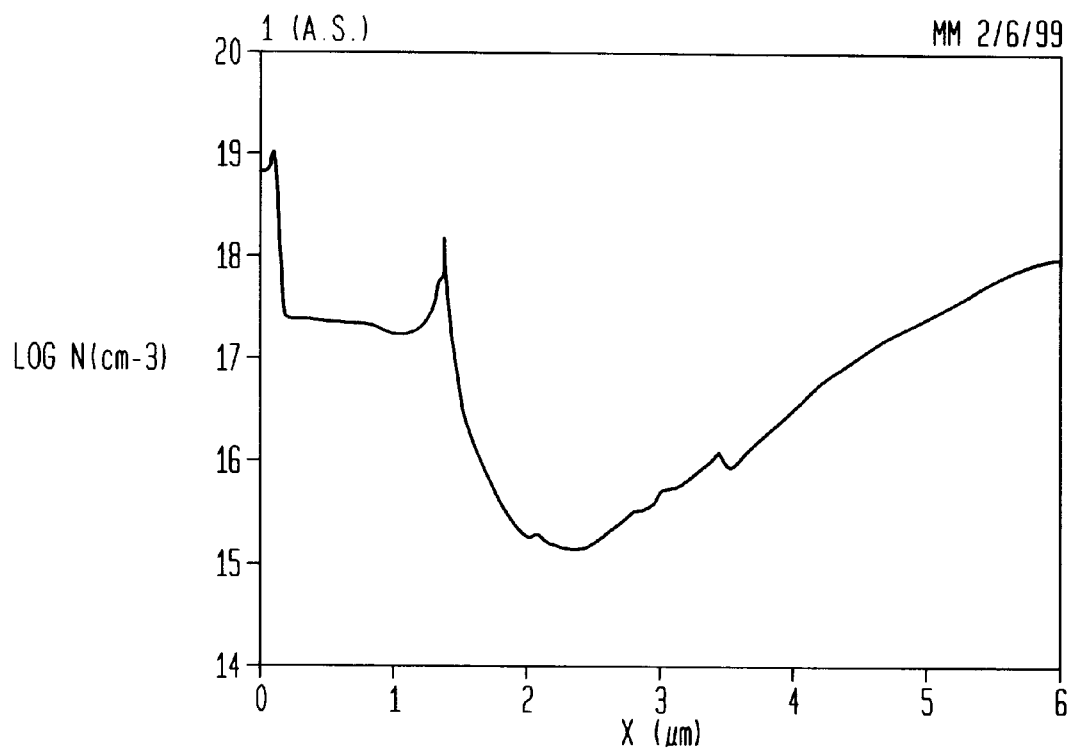
FIGS. 5a and 5b illustrate the electrochemical capacitance-voltage dopant profile of a broad area diffused sanile showing the successful diffusion of Zn-dopant.
Figure 5B:
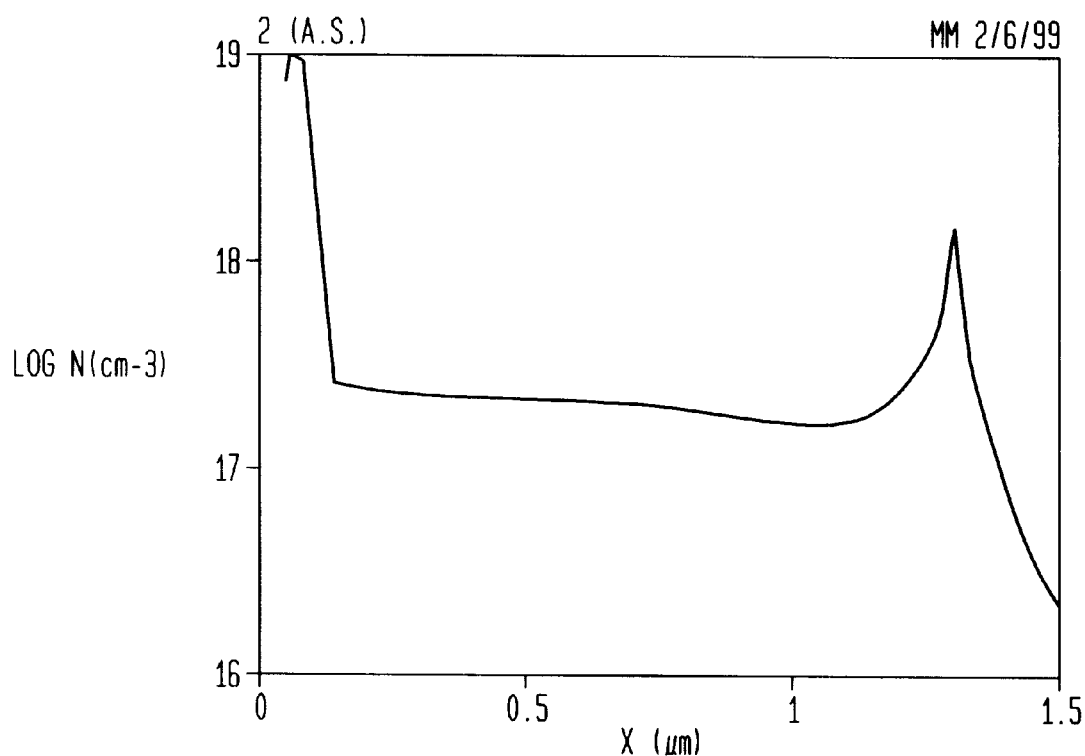

FIGS. 5a and 5b illustrate the doping profile of a diffused sample exhibiting the diffusion of Zn to the underlying structure. This diffusion is typical of the Zn diffusion Region 22 shown in FIG. 3. FIGS. 6a, 6b and 7a, and 7b show typical current-voltage characteristics for 75 μm diameter and 500 μm diameter diodes fabricated by the techniques described herein.

This disclosure describes a device structure and fabrication process using an epitaxially grown source for the Zn diffusion that provides simple, reliable and unlimited device scalability for large-element arrays of InGaAs p-i-n photodiodes. Specifically, a device design is employed that uses an epitaxially grown Zn-doped layer that when photolithographically patterned and annealed defines the elements of the photodiode array. In this disclosure, results are presented from the diffusion of Zn from an epitaxially grown source, and in addition, results are presented from p-i-n photodiodes fabricated using this process.

EXAMPLES

As shown in FIG. 1, a commercial epitaxial wafer vendor grew the samples 10 by atmospheric pressure metalorganic chemical vapor phase epitaxy. The material was grown on InP 50 mm diameter substrates 12. A buffer of S-doped InP 14 was grown followed by a 3.5 μm thick, undoped InGaAs absorption layer 16. Next, a 1 μm InP layer 18 was grown doped $2-4 \times 10^{16}/cm^3$ with S. The final Zn source cap layer 20 consisting of 0.15 μm of InGaAs doped $2-3 \times 10^{19}/cm^3$ with Zn was grown.

Diffusion:

For the diffusion study, a sample of as-grown material was capped with 1000 Å of $SiN_x$ deposited by PECVD, (sample A). The sample was annealed in an open-tube furnace at 500° C. for 50 minutes (sample B). The as-grown and diffused samples were measured using electrochemical CV dopant profiler to determine the effect of diffusion and junction placement.

Photodiode Fabrication:

The p-i-n photodiodes were fabricated using standard semiconductor processing techniques. The InGaAs cap 20 was selectively removed using standard photolithography to pattern a PECVD $SiN_x$ layer. The device geometries used were 75,300 and 500 μm diameter circular detectors. After patterning, the InGaAs cap was etched, as shown in FIG. 2, using a selective etch comprised of citric acid and hydrogen peroxide. After selective removal of the InGaAs the $SiN_x$ was stripped and another layer of $SiN_x$ was uniformly deposited on the wafer. The sample was then diffused at 500° C. for 1 hour. Following diffusion the sample was patterned to open p-contact vias in the Zn-diffused cap region 22, as shown in FIG. 3. P-contacts were defined by metal-lift-off process. Samples were prepared with both Au/Zn alloyed contacts (375° C. 60 sec) and Ti/Au contacts. Broad area n-contacts were applied to the InP substrate and annealed at 380° C. for 60 seconds. The cross section of the photodiode fabrication steps is shown in FIGS. 2 and 3.

The devices were mounted onto a standard TO header using silver epoxy and wire bonded for characterization, which included standard I–V, and spectral response. Spectral response and quantum efficiency data was collected using a 0.25 m monochrometer with a W lamp. Current-voltage data was collected using an HP 4156B semiconductor parameter analyzer.

Diffusion Results:

FIG. 4a illustrates the electrochemical current-voltage dopant profile for the as-grown sample (sample A). As can be seen in these results, there is minimal out-diffusion of the InGaAs into the underlying layers during crystal growth (C. Blaauw, et al, "Secondary ion mass spectrometry and electrical characterization of ZN diffusion in n-type-InP," J. Appl. Phys. 66 (2), 1989, pp 605–610.). FIG. 4b illustrates a higher spatial resolution profile of the as-grown sample. The p-type layer clearly terminates abruptly at the InGaAs-InP interface. This is partially due to the slow diffusion of Zn in InGaAs relative to that of InP (N. Arnold, et al, "Diffusion in III–V semiconductors from spin-on film sources," J. Phys. D: Appl. Phys., 17, 1984, pp. 443–474.).

FIGS. 5a and 5b show the electrochemical C-V profile of the sample diffused at 500° C. for 50 minutes (sample B). The Zn has clearly diffused into the underlying InP and into the InGaAs undoped absorption region. FIG. 5b shows a higher spatial resolution profile of the same sample. The Zn-diffused region extends 1.3 μm into the sample with an average net doping level of $2 \times 10^{17}/cm^3$, sufficient for the fabrication of a p-i-n photodiode. The heavily Zn-doped p-type cap is evident and extends to approximately 0.15 μm. Most of the Zn remains in the cap region because the diffusion coefficient of Zn in InGaAs is small compared to that in InP, as mentioned previously.

Figure 6A:
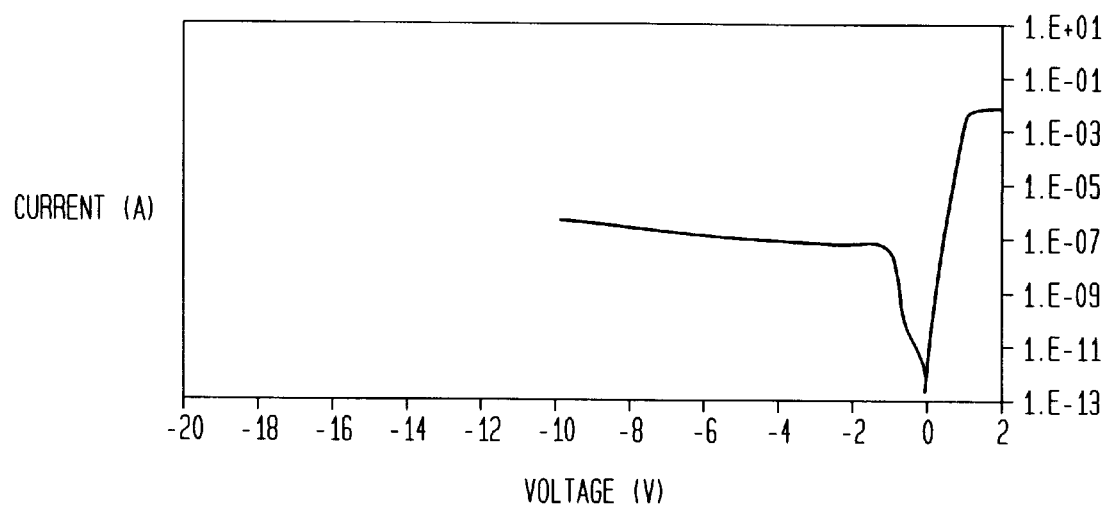
FIGS. 6a and 6b illustrate the current-voltage characteristics of p-i-n photodiode with 75 μm diameter with Ti/Au and A Zn contacts
Figure 6B:
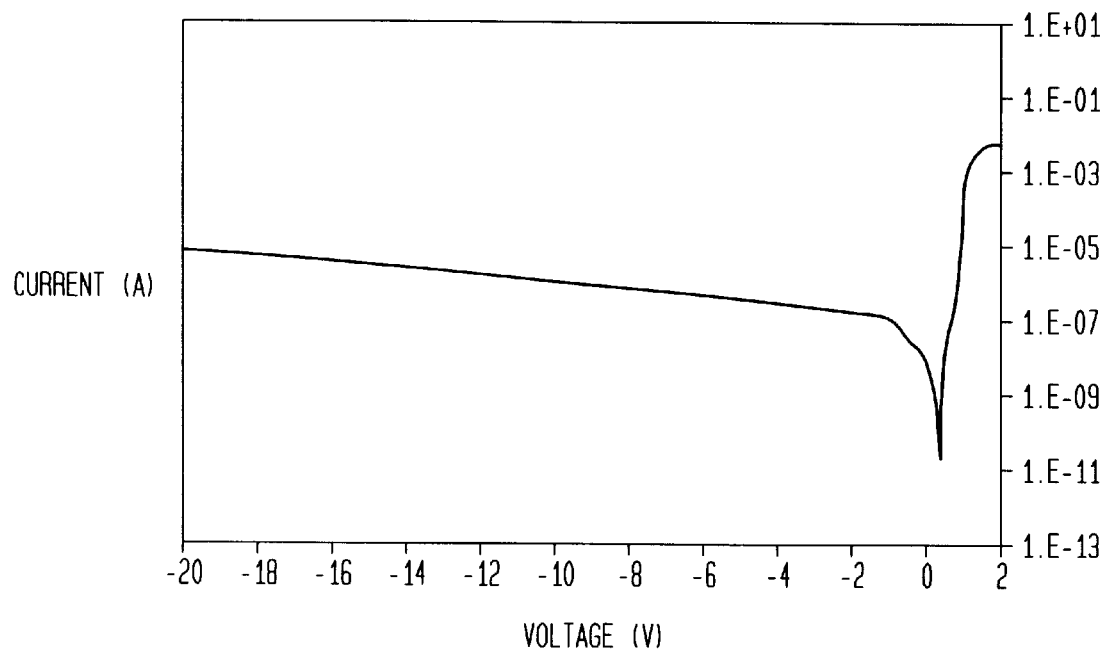

Device Results:

FIGS. 6a and 6b illustrates the I–V results for the 75 μm diameter diode with Ti/Au and Au/Zn contacts. The dark current at 25 mV reverse bias is measured to be 541 pA for the sample with Ti/Au contacts. The series resistance of the two devices were measured as 163Ω and 128Ω, respectively for the Ti/Au and Au/Zn contacts at 1 mA forward bias.

Figure 7A:
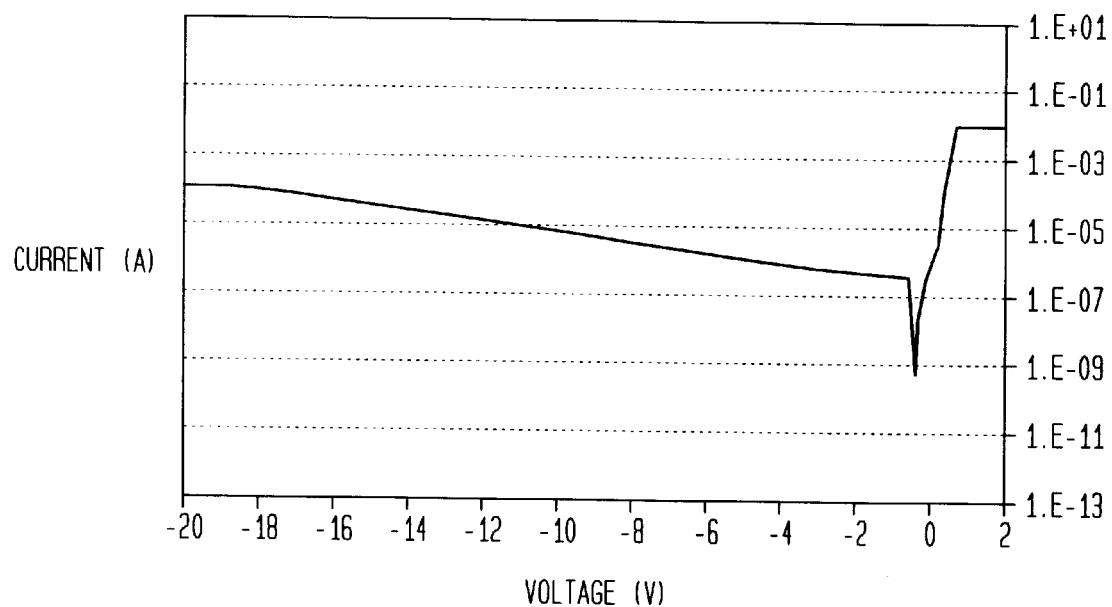
FIGS. 7a and 7b illustrate the current-voltage characteristics of 500 μm diameter diodes fabricated using this method using Ti/Au and Au/Zn contact metallizations.
Figure 7B:
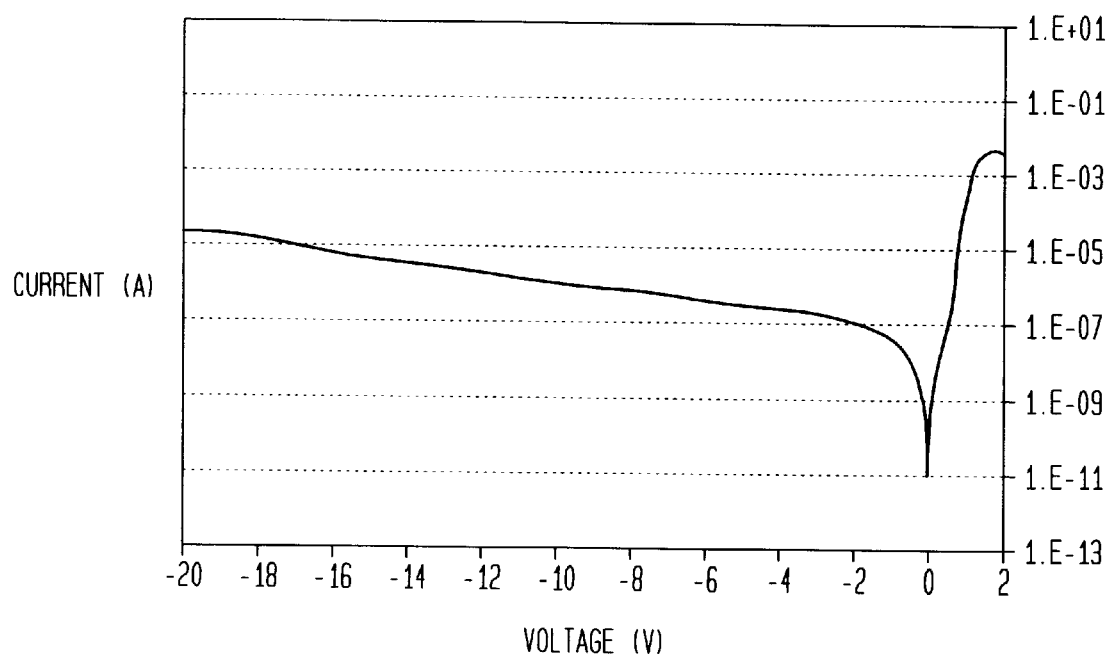

FIGS. 7a and 7b illustrate the dark current at 25 mV reverse bias of the 500μm diameter diode is 28 nA. The series resistance of the two devices were measured as 45.6Ω and 42.5Ω, respectively for the Ti/Au and Au/Zn contacts at 1 mA forward bias.

From these data it is clear that the method is successful for fabrication of p-i-n photodiodes.

Typical advantages of the embodiment of this invention over the prior art are:

First—Infinite scalability. The size of the wafer is limited only by the size that can be accommodated in the epitaxial reactor.

Second—Process simplification.
  a. The encapsulant used may also serve as the AR optical coating layer, simplifying the process by eliminating one $SiN_x$ deposition step.
  b. Ti/Au metallization may be used instead of Au/Zn, eliminating the Au/Zn metallization altogether (currently a two-step metallization is used).

Third—Reduced process cycle time.

Fourth—Improved process cleanliness. The process will generate much less particulate to contaminate the wafer.

Fifth—Lower wafer breakage. With less wafer handling the probability of wafer breakage is greatly reduced.

Sixth—Improved contact resistance due to lower bandgap, heavily-doped contact layer (InGaAs).

Seventh—Improved visible response because with a non-alloyed contact, it is possible to make the InP cap layer thinner and more transparent to visible light.

While the invention has been described with reference to the preferred embodiment thereof, it will be appreciated by those of ordinary skill in the art that modifications can be made to the structure and elements of the invention without departing from the spirit and scope of the invention as a whole.

What is claimed is:

1. A photodiode apparatus on a semiconductor substrate comprising:

a first layer region (14) located adjacent to said substrate and comprising a layer of indium phosphate doped n-type material at a level of between $1\times10^{17}/cm^3$ and $2\times10^{18}/cm^3$;

a second layer region (16) consisting of an indium gallium arsenide layer which is nominally lattice-matched to said first layer region (14) and having a thickness of between 0.5 and 5 µm and is not intentionally doped;

a third layer region (18) consisting of a layer of indium phosphide approximately 1 µm thick and doped at a level of about $4\times10^{16}/cm^3$;

a fourth layer region (20) comprising a patterned p-type layer of indium gallium arsenide doped p-type with dopant at a level of approximately $2\times10^{19}/cm^3$ and with a thickness of approximately 0.15 µm; and, a fifth region (22) comprising a dopant diffused region which extends from said third layer region (18) into said second layer region (16).

2. The apparatus of claim 1 wherein said fourth region (18) is doped with Zn between $1\times10^{17}/cm^3$ and $2\times10^{19}/cm^3$.

3. The apparatus of claim 1 wherein said fourth layer region (20) is doped with Be.

4. The apparatus of claim 1 wherein said fourth layer region (20) is doped with Be between $1\times10^{18}/cm^3$ and $2\times10^{19}/cm^3$.

5. The apparatus of claim 1 wherein said fourth layer region (20) consists of InGaAsP.

6. The apparatus of claim 1 wherein said fourth layer region (20) consists of InAlAs.

7. The apparatus of claim 1 where the dopant of said fourth layer region (20) is any p-type dopant for III–V semiconductors.

8. The apparatus of claim 1 where the p-type dopant concentration of said fourth layer region (20) is between $1\times10^{16}/cm^3$ and $1\times10^{20}/cm^3$.

* * * * *